United States Patent [19]
Arakawa

[11] Patent Number: 5,612,553
[45] Date of Patent: Mar. 18, 1997

[54] SEMICONDUCTOR INTEGRATED CIRCUIT AND METHOD OF FABRICATING SAME AND METHOD OF ARRANGING CELLS

[75] Inventor: Takahiko Arakawa, Itami, Japan

[73] Assignee: Mitsubishi Denki Kabushiki Kaisha, Tokyo, Japan

[21] Appl. No.: 435,659

[22] Filed: May 5, 1995

[30] Foreign Application Priority Data

Aug. 9, 1994 [JP] Japan .................................... 6-186972

[51] Int. Cl.$^6$ .................................................. H01L 27/10
[52] U.S. Cl. ........................................... 257/206; 257/211
[58] Field of Search ..................................... 257/206, 211

[56] References Cited

U.S. PATENT DOCUMENTS 5,217,915  6/1993  Hashimoto et al. ....................... 437/48

OTHER PUBLICATIONS

Nikkei Microdevices, Jun. 1989, pp. 86–101, "200,000 Gate Class Overall Sea Of Gate; Favorite Of Large–Scale Gate Array Which Is Waiting Its Turn".

Primary Examiner—Mark V. Prenty
Attorney, Agent, or Firm—Oblon, Spivak, McClelland, Maier & Neustadt, P.C.

[57] ABSTRACT

A semiconductor integrated circuit including a transistor portion having operating characteristics which are not varied by wiring operation, and a method of fabricating the same are disclosed. A PMOS transistor portion (PT) includes first layer metal lines (7A) extending outwardly beyond P-type diffused regions (3) and permitted to have contact holes (6) therein over regions external to the P-type diffused regions (3). That is, the first layer metal lines (7A) have out-of-diffused-region connecting regions for electrical connection over the regions external to the P-type diffused regions (3). Likewise, an NMOS transistor portion (NT) includes first layer metal lines (7A) extending outwardly beyond N-type diffused regions (5) and permitted to have contact holes (6) therein over regions external to the N-type cliffused regions (5).

5 Claims, 18 Drawing Sheets

F I G. 6
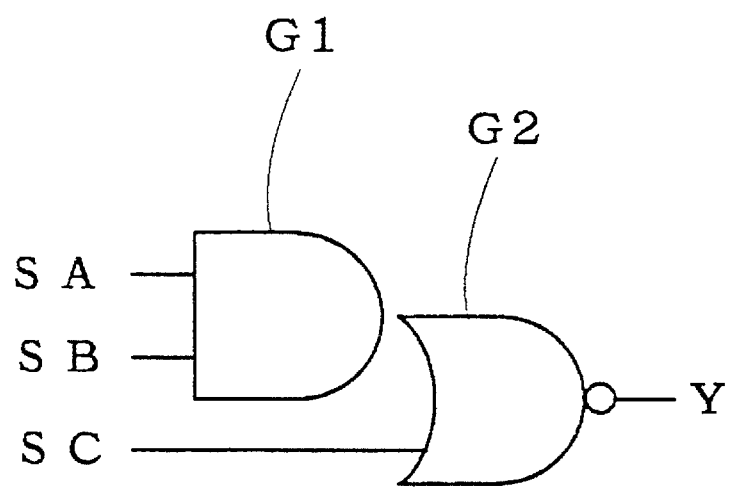

SEMICONDUCTOR INTEGRATED CIRCUIT AND METHOD OF FABRICATING SAME AND METHOD OF ARRANGING CELLS

BACKGROUND OF THE INVENTION

1. Field of the Invention

The present invention relates to a semiconductor integrated circuit of a gate array approach, a method of fabricating the same, and a method of arranging cells.

2. Description of the Background Art

In general, semiconductor integrated circuits of a gate array approach are subjected to common process steps until a transistor forming process step but are customized in a metal wiring process step. A common transistor region includes basic cells having a plurality of transistors as a basic unit and arranged regularly on an LSI chip.

An example of the gate array approach semiconductor integrated circuits is disclosed in, for example, "Nikkei Micro Device, June, 1989, 'Prospective Winner of Stand-by Large-Scale Gate Arrays, Sea of Two Hundred Thousand Gates Type', p. 94, FIG. 8" in which the basic cells are designed to facilitate the customization of a minimum gate unit for a logic suitable for arrangement of memory cells such as two-input NAND gates.

FIG. 21 is a plan view of a conventional basic cell. As shown in FIG. 21, a basic cell 41 comprises gate electrodes 42, P-type diffused regions 43, gate electrodes 44, N-type diffused regions 45, contact holes 46, and first layer metal lines 47. FIG. 22 is a cross-sectional view taken along the line A—A of FIG. 21. In FIG. 22, the reference numeral 21 designates a semiconductor chip, and 22 designates field oxide films 22.

Referring to FIGS. 21 and 22, the P-type diffused regions 43A, 43B, 43C are selectively formed in the surface of the semiconductor chip 21, and the two gate electrodes 42 are formed respectively on a region between the P-type diffused regions 43A and 43B and a region between the P-type diffused regions 43B and 43C. The gate electrodes 42 and the P-type diffused regions 43 (43A, 43B, 43C) form a PMOS transistor. On the other hand, the N-type diffused regions 45A, 45B, 45C are selectively formed in the surface of the semiconductor chip 21, and the two gate electrodes 44 are formed respectively on a region between the N-type diffused regions 45A and 45B and a region between the N-type diffused regions 45B and 45C. The gate electrodes 44 and the N-type diffused regions 45 (45A, 45B, 45C) form an NMOS transistor.

The first layer metal lines 47 (47A to 47F) for macro cell formation are selectively formed in the basic cell 41. The first layer metal lines 47B are formed over the P-type diffused regions 43 and are electrically connected to the P-type diffused regions 43 through contact holes 46. The first layer metal line 47A is a line for a power supply and is electrically connected to the first layer metal lines 47B through at least one of the contact holes 46. The first layer metal lines 47C are lines for connection between the diffused regions in the PMOS and NMOS transistors. The first layer metal lines 47D are lines for connection between the gates of the PMOS and NMOS transistors. The first layer metal lines 47E are formed over the N-type diffused regions 45 and are electrically connected to the N-type diffused regions 45 through contact holes 46. The first layer metal line 47F is a line for a ground and is electrically connected to the first layer metal lines 47E through contact holes 46.

In this manner, predetermined logic functions are set to the basic cell 41 which in turn serves as a macro cell by the electrical connections by the first layer metal lines 47 and through the contact holes 46.

Logic gates (macro cells) are customized mainly by contact holes (the contact holes 46 of FIG. 21) and first layer lines (the first layer metal lines 47 of FIG. 21) and, as the case may be, by using second layer lines and first via holes (holes for connection between the first and second layer lines).

However, various macro cells must be formed using one or more basic cells of predetermined construction, and the number and position of contacts with the diffused regions serving as source/drain regions of MOS transistors are different depending on basic cells. Thus a need exists to ensure a given area or more of the diffused regions to insure the number of contacts, which does not permit reduction in transistor gate width and, accordingly, reduction in capacitance.

The diffused regions have a resistance higher than the metal lines, and the operating characteristics of the transistors are deteriorated without good contacts being set between the diffused regions and the metal lines, resulting in changes in the operating characteristics of the macro cells formed by means of the basic cells depending on the number and position of contacts with the diffused regions.

Further, there is only one type of conventional gate array approach basic cells. Therefore, the formation of macro cells of different operating characteristics requires changes in layout (wiring pattern) of the macro cells themselves.

SUMMARY OF THE INVENTION

The present invention is intended for a semiconductor integrated circuit including a plurality of basic cells arranged on a semiconductor chip, each of the plurality of basic cells including a transistor portion. According to the present invention, the transistor portion comprises: first and second diffused regions of a predetermined conductivity type and selectively formed on the semiconductor chip; a control electrode formed on a region between the first and second diffused regions; and a diffused region line formed on a wiring-required diffused region, the wiring-required diffused region being at least one of the first and second diffused regions, the diffused region line being electrically connected to the wiring-required diffused region, wherein the diffused region line of the transistor portion extends outwardly beyond the wiring-required diffused region and includes an out-of-diffused-region connecting region for electrical connection over a region external to the wiring-required diffused region.

As above described, the diffused region line of the transistor portion in each basic cell of the semiconductor integrated circuit extends outwardly beyond the wiring-required diffused region and includes the out-of-diffused-region connecting region for electrical connection over the region external to the wiring-required diffused region. Electrical connection to an object to be connecting other than the wiring-required diffused region may be made through the out-of-diffused-region connecting region of the diffused region line. The entire areas of the diffused region line over the diffused region may be used for electrical connection to the diffused region.

As a result, constantly good electrical connection is held between the diffused region and the diffused region line, and characteristics of the transistor portion are not varied by the wiring operation for forming a macro cell.

Preferably, the diffused region line is formed in a first layer; each of the plurality of basic cells further includes a first transistor line formed in a second layer different from the first layer, and first contact means having a first end connected to the first transistor line and a second end connected to the out-of-diffused-region connecting region of the diffused region line for electrical connection between the first transistor line and the diffused region line; the transistor portion includes a plurality of transistor portions each including a control electrode line formed in the first layer over a region of the control electrode, and second contact means having a first end connected to the first transistor line and a second end connected to the control electrode line for electrical connection between the first transistor line and the control electrode line; and at least the first and second contact means electrically connect at least two of the plurality of transistor portions to establish a first logic function.

The first contact means for electrical connection between the first transistor line and the diffused region line and the second contact means for electrical connection between the first transistor line and the control electrode line electrically connect at least two of the plurality of transistor portions to establish the first logic function. This eliminates the need to performing wiring for logic function establishment in a later stage.

Preferably, each of the plurality of transistor portions further includes: a second transistor line formed in a third layer different from the first and second layers; and third contact means for electrically connecting one of the diffused region line, the control electrode line and the first transistor line to the second transistor line, and the third contact means, in cooperation with the first and second contact means, electrically connects at least two of the plurality of transistor portions to establish the first logic function.

The provision of the third contact means for electrical connection between one of the diffused region line, the control electrode line and the first transistor line, and the second transistor line permits a more complicated logic function to be established.

Preferably, each of the plurality of basic cells includes a second transistor line formed in the first layer and electrically connected to the control electrode lines or the diffused region lines of the plurality of transistor portions, and the second transistor line, in cooperation with the first and second contact means, electrically connects at least two of the plurality of transistor portions to establish the first logic function.

The provision of the second transistor line formed in the first layer and electrically connected to the control electrode lines or the diffused region lines of the plurality of transistor portions allows the diffused region line in the first layer, the control electrode line and the second transistor line to establish the first logic function.

The result is the increase in the range in which the transistor line in the second layer can be used, thereby increasing the level of integration of the lines between the basic cells.

In another aspect of the present invention, a semiconductor integrated circuit comprises: a semiconductor chip; a plurality of first basic cells arranged on the semiconductor chip and each including a first transistor portion; and a plurality of second basic cells arranged on the semiconductor chip and each including a second transistor portion, the first transistor portion having a gate width different from a gate width of the second transistor portion.

In this semiconductor integrated circuit, the plurality of first basic cells each having the first transistor portion and the plurality of second basic cells each having the second transistor portion are formed on the same semiconductor chip, and the gate width of the first transistor portion is different from that of the second transistor portion.

Thus, the first or second basic cells having the transistor portions of the desired gate width may be selected in customization without changing the layout (wiring pattern) in the macro cell.

As a result, only one layout library for the macro cell is required, and the logic circuit having optimized characteristics based on the different gate widths of the transistor portions can be provided relatively easily.

The present invention is also intended for a method of fabricating a semiconductor integrated circuit including a plurality of basic cells arranged on a semiconductor chip for production of a transistor portion in each of the plurality of basic cells of the semiconductor integrated circuit. According to the present invention, the method comprises the steps of: (a) selectively forming a field oxide film on the semiconductor chip, the field oxide film separating a surface of the semiconductor chip into field regions; (b) selectively forming a control electrode on the semiconductor chip including the field regions; (c) forming diffuse regions in the field regions by using the control electrode as a mask; and (d) forming a diffused region line for electrical connection over the diffused regions, the control electrode, the diffused regions, and the diffused region line forming the transistor portion, wherein variation only in size of the field regions formed in the step (a) varies a size of the diffused regions of the transistor portion to provide different operating characteristics of the transistor portion.

Since the size of the diffused regions of the transistor is varied by varying only the size of the field regions formed in the step (a) to provide the predetermined different operating characteristics of the transistor portion, the variation of the predetermined operating characteristics of the transistor portion requires only the variation of the step (a), with other steps used in a conventional manner.

The result is the production of the plurality of basic cells having the predetermined different operating characteristics only by simply changing the process step.

The present invention is also intended for a method of arranging a plurality of first basic cells and a plurality of second basic cells on a semiconductor chip, each of the plurality of first basic cells having a transistor portion of a first gate width, each of the plurality of second basic cells having a transistor portion of a second gate width different from the first gate width. According to the present invention, the method comprises the steps of: (a) determining an operating characteristic of a desired logic circuit; and (b) arranging the plurality of first basic cells and the plurality of second basic cells in mixed relation on the semiconductor chip on the basis of the operating characteristic determined in the step (a).

This method employs the first basic cells each having the transistor portion of the first gate width and the second basic cells each having the transistor portion of the second gate width. The plurality of first basic cells and the plurality of second basic cells are arranged in mixed relation on the chip so as to be adapted for the operating characteristic of the desired logic circuit, thereby providing the desired operating characteristic in customization without changing the layout (wiring pattern) for forming the desired logic circuit.

As a result, only one layout library for the desired logic circuit with the operating characteristic is required, and the cell arrangement which readily constructs the logic circuit having the optimized characteristics may be accomplished.

It is therefore an object of the present invention to provide a semiconductor integrated circuit including a transistor portion having operating characteristics which are not varied by wiring and a method of fabricating the same, and to provide a semiconductor integrated circuit having operating characteristics which are variable without changes in macro cell layout and a method of arranging cells.

These and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a circuit diagram of a logic circuit formed in FIGS. 4 and 5;

DESCRIPTION OF THE PREFERRED EMBODIMENTS

<First Preferred Embodiment>

Figure 1:
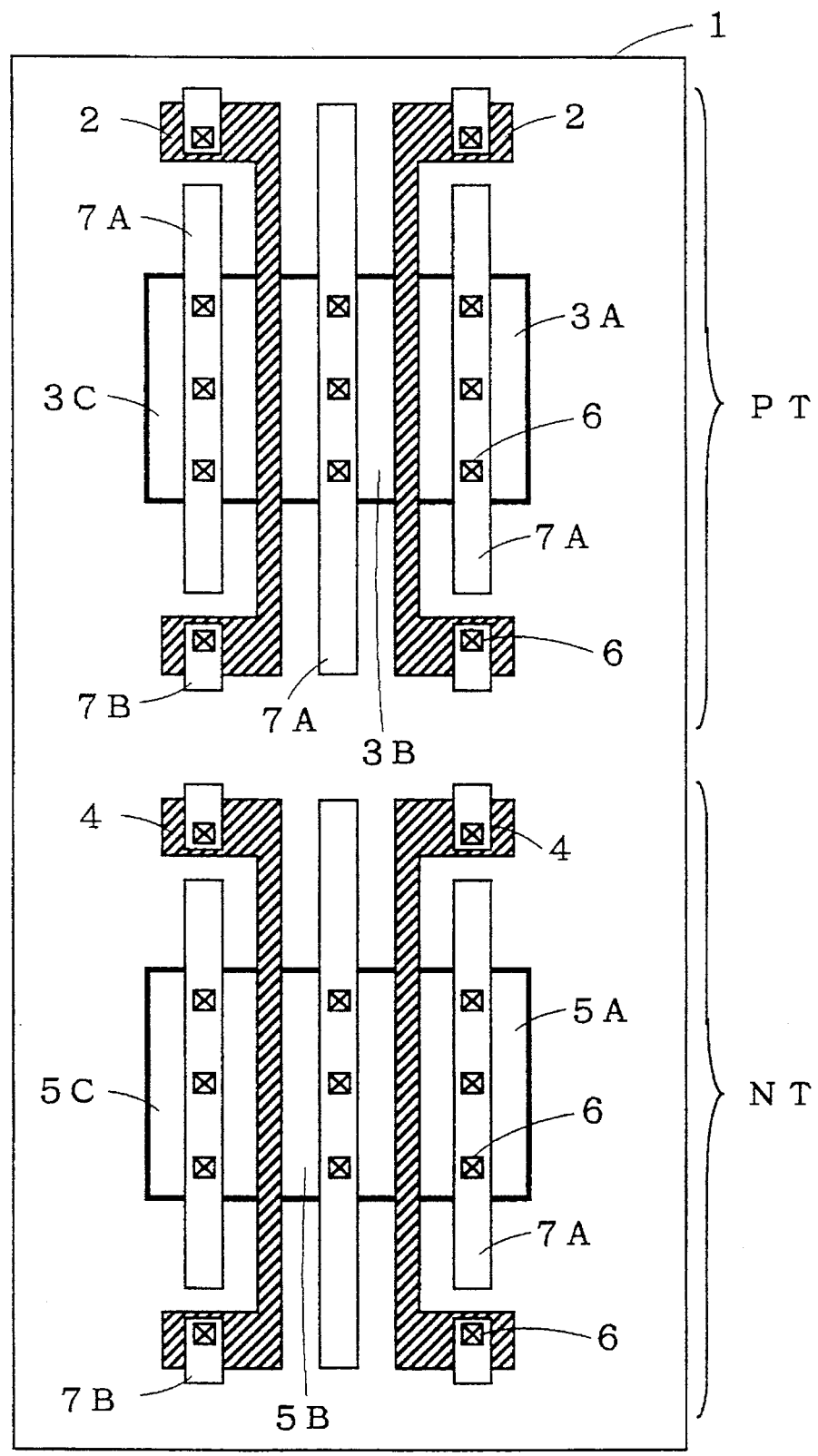
FIG. 1 is a plan view of a basic cell for a semiconductor integrated circuit of a gate array approach according to a first preferred embodiment of the present invention.
Figure 2:
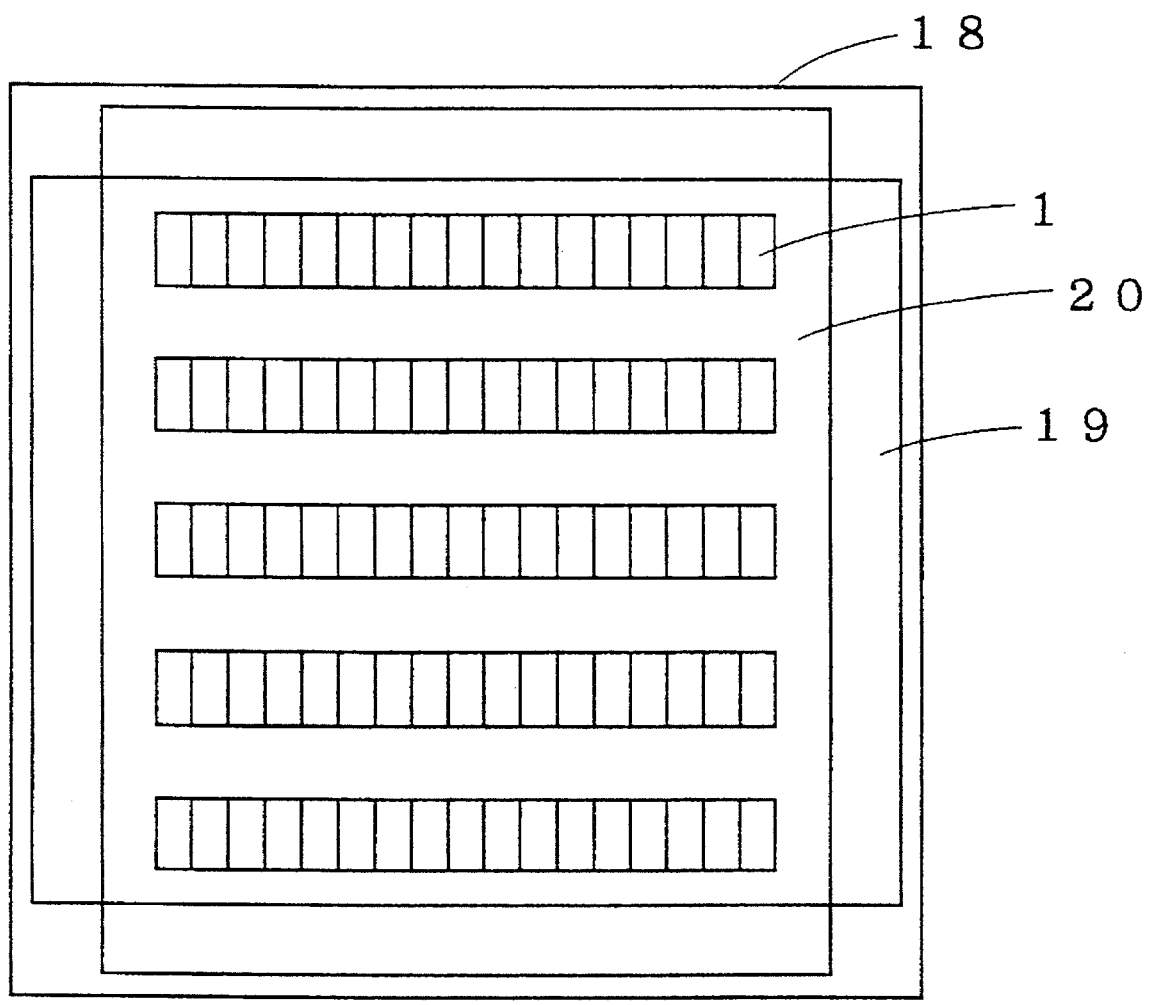
FIG. 2 illustrates the entire structure of the semiconductor integrated circuit of the first preferred embodiment.

FIG. 1 is a plan view of one of a plurality of basic cells arranged in a semiconductor integrated circuit of a gate array approach according to a first preferred embodiment of the present invention. Referring to FIG. 2, the basic cells 1 shown in FIG. 1 are regularly arranged within a logic gate region 20 on a gate array chip 18. The reference numeral 19 designates an input-output interface portion.

Referring to FIG. 1, P-type diffused regions 3A, 3B, 3C are selectively formed on the surface of the gate array chip 18, and two gate electrodes 2 are formed respectively on a region between the P-type diffused regions 3A and 3B and a region between the P type diffused regions 3B and 3C. The gate electrodes 2 and the P-type diffused regions 3 (3A to 3C) form a PMOS transistor portion PT. On the other hand, N-type diffused regions 5A, 5B, 5C are selectively formed on the surface of the gate array chip 18, and two gate electrodes 4 are formed respectively on a region between the N-type diffused regions 5A and 5B and a region between the N-type diffused regions 5B and 5C. The gate electrodes 4 and the N-type diffused regions 5 (5A to 5C) form an NMOS transistor portion NT.

First layer metal lines 7A are formed over the respective P-type diffused regions 3A to 3C and over the respective N-type diffused regions 5A to 5C. The first layer metal lines 7A over the P-type diffused regions 3 are electrically connected to the P-type diffused regions 3 through contact holes 6, and the first layer metal lines 7A over the N-type diffused regions 5 are electrically connected to the N-type diffused regions 5 through contact holes 6.

The respective first layer metal lines 7A in the PMOS transistor portion PT extend outwardly beyond the P-type diffused regions 3 and may be formed with contact holes 6 over regions external to the P-type diffused regions 3. That is, the first layer metal lines 7A include out-of-diffused-region connecting regions for electrical connection over the regions external to the P-type diffused regions 3. Likewise, the first layer metal lines 7A in the NMOS transistor portion NT extend outwardly beyond the N-type diffused regions 5 and may be formed with contact holes 6 over regions external to the N-type diffused regions 5.

First layer metal lines 7B are formed over the ends of the gate electrodes 2 and 4 and are electrically connected to the gate electrodes 2 (the gate electrodes 4) through contact holes 6.

The gate array approach semiconductor integrated circuit of the first preferred embodiment as above constructed is designed such that the first layer metal lines 7A extend outwardly beyond the diffused regions (P-type diffused regions 3 and N-type diffused regions 5) to form the out-of-diffused-region connecting regions for electrical connection over the regions external to the diffused regions.

Thus the electrical connection to objects to be connected other than the diffused regions via the first layer metal lines 7A is made through the out-of-diffused-region connecting regions of the first layer metal lines 7A. This allows the entire areas of the first layer metal lines 7A over the diffused regions to be used for electrical connection to the diffused regions.

Consequently, a sufficient number of contact holes 6 are formed over the diffused regions to hold a good electrical connection between the first layer metal lines 7A over the diffused regions and the diffused regions. Therefore, wiring operation (layout for macro cell arrangement) in the subsequent step does not vary the operating characteristics of the transistors.

<Second Preferred Embodiment>

Figure 3:
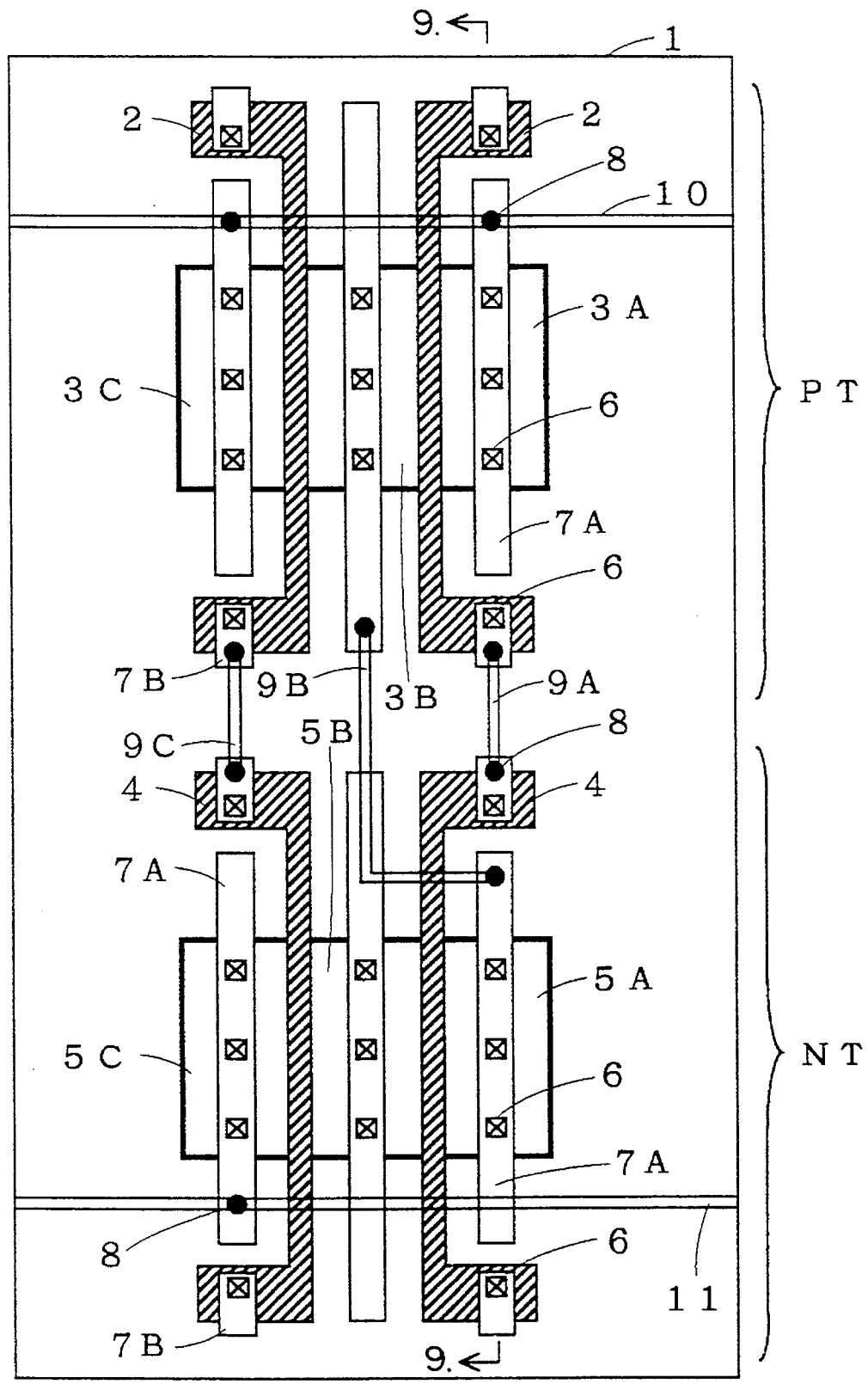
FIG. 3 is a plan view of the basic cell for the gate array approach semiconductor integrated circuit according to a second preferred embodiment of the present invention.

FIG. 3 is a plan view of one of the plurality of basic cells arranged in the gate array approach semiconductor integrated circuit according to a second preferred embodiment of the present invention. Like the first preferred embodiment, the basic cells 1 of the second preferred embodiment shown in FIG. 3 are regularly arranged within the logic gate region 20 on the gate array chip 18 as shown in FIG. 2.

Referring to FIG. 3, second layer metal lines 9 to 11 are formed in a different layer from the first layer metal lines 7A. The second layer metal lines 9 to 11 are used as lines (transistor lines) for the transistor portions PT and NT.

The second layer metal line 10 is used as a power supply line and is electrically connected to the first layer metal lines 7A through first via holes 8 formed on the out-of-diffused-region connecting regions of the first layer metal lines 7A formed over the P-type diffused regions 3A and 3C.

The second layer metal line 11 is used as a ground line and is electrically connected to the first layer metal lines 7A through a first via hole 8 formed on the out-of-diffused-region connecting region of the first layer metal line 7A formed over the N-type diffused region 5C.

The second layer metal lines 9 (9A to 9C) are used for connection between the PMOS transistor portion PT and the NMOS transistor portion NT. The second layer metal lines 9A and 9C establish electrical connection between the first layer metal lines 7B in the PMOS transistor portion PT and the first layer metal lines 7B in the NMOS transistor portion NT. The second layer metal line 9B establishes electrical connection between the first layer metal line 7A over the P-type diffused region 3B in the PMOS transistor portion PT and the first layer metal line 7A over the N-type diffused region 5A in the NMOS transistor portion NT.

Other constructions of the basic cell 1 of the second preferred embodiment are similar to those of the basic cell 1 of the first preferred embodiment, and the description thereof is omitted herein.

Such an arrangement provides for customization of a macro cell for a two-input NAND gate including the second layer metal lines 9A and 9C serving as input lines and the second layer metal line 9B serving as an output line.

Like the first preferred embodiment, the gate array approach semiconductor integrated circuit of the second preferred embodiment is designed such that the first layer metal lines 7A extend outwardly beyond the diffused regions (P-type diffused regions 3 and N-type diffused regions 5) to form the out-of-diffused-region connecting regions for electrical connection over the regions external to the diffused regions.

Thus the electrical connection to the objects to be connected (the second layer metal lines 10 and 11) other than the diffused regions via the first layer metal lines 7A is made through the out-of-diffused-region connecting regions of the first layer metal lines 7A. This allows the entire areas of the first layer metal lines 7A over the diffused regions to be used for electrical connection to the diffused regions.

Consequently, a sufficient number of contact holes 6 are formed in the first layer metal lines 7A over the diffused regions to hold a good electrical connection between the first layer metal lines 7A and the diffused regions. Therefore, the wiring operation in the subsequent step does not vary the operating characteristics of the transistors.

In addition, the logic establishment of the two-input NAND gate has been already made and it is hence unnecessary to form an NAND gate by the subsequent wiring operation. The achievement of the input and output lines of the two-input NAND gate by using the second layer metal lines 9 allows the wiring operation to be performed on the first layer metal lines 7 without any problems, thereby facilitating arrangement and wiring and increasing the level of integration.

<Third Preferred Embodiment>

Figure 4:
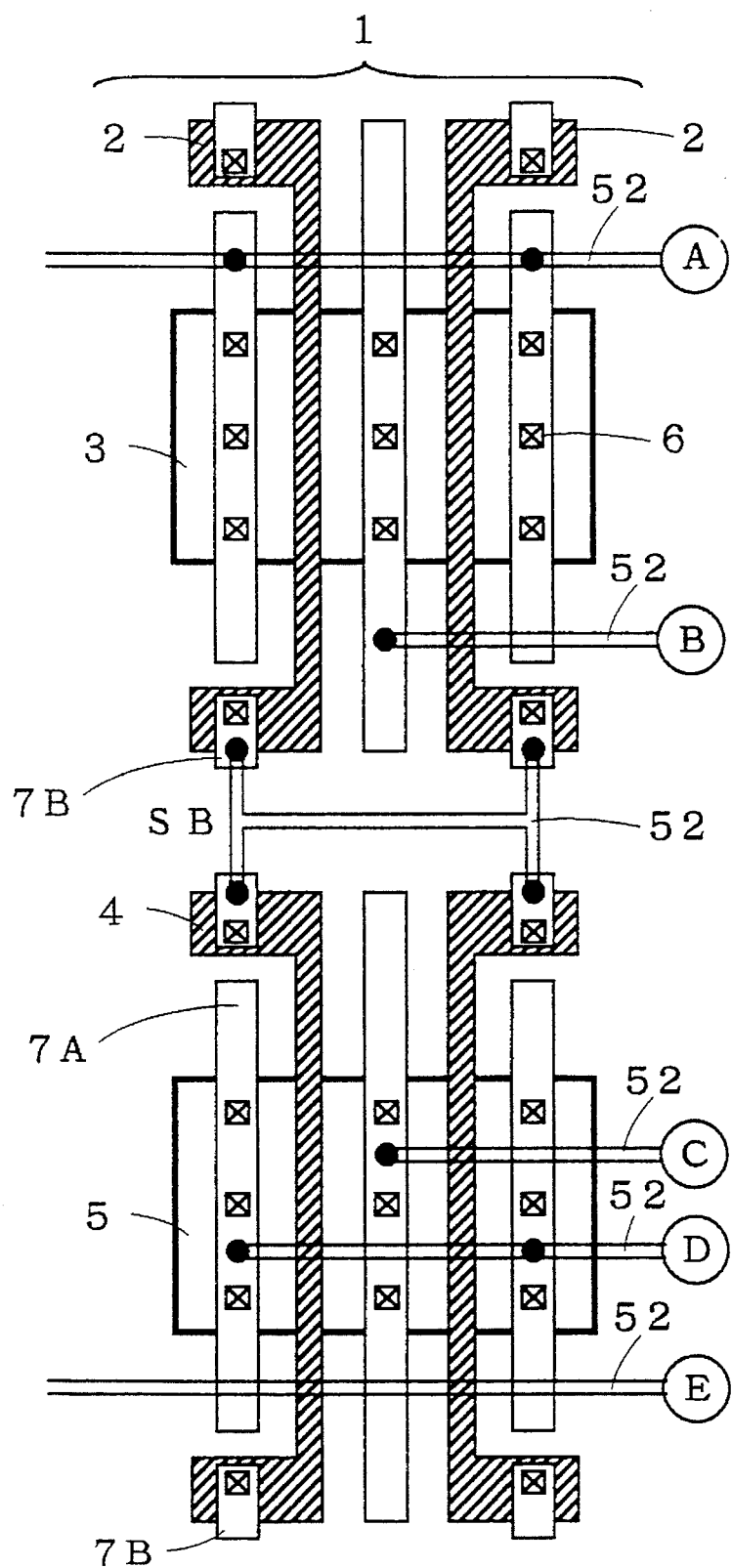
FIGS. 4 and 5 are plan views of basic cells for the gate array approach semiconductor integrated circuit according to a third preferred embodiment of the present invention.
Figure 5:
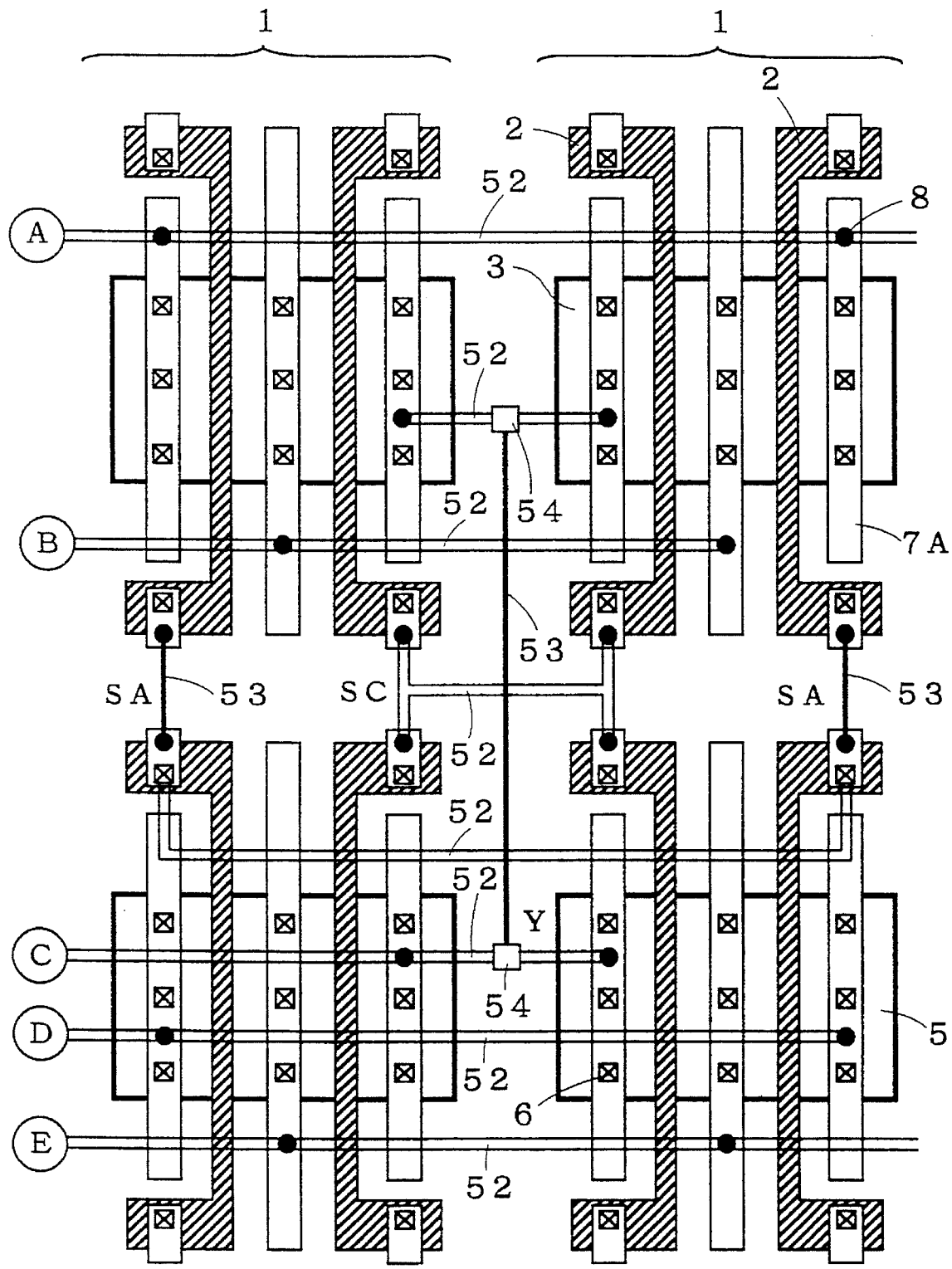

FIGS. 4 and 5 are plan views of a macro cell including three basic cells arranged in the gate array approach semiconductor integrated circuit according to a third preferred embodiment of the present invention. Like the first and second preferred embodiments, the basic cells 1 of the third preferred embodiment shown in FIGS. 4 and 5 are regularly arranged within the logic gate region 20 on the gate array chip 18 as shown in FIG. 2.

Referring to FIGS. 4 and 5, each basic cell 1 comprises the gate electrodes 2, the P-type diffused region 3, the gate electrodes 4, the N-type diffused region 5, the contact holes 6, and the first layer metal lines 7 (7A and 7B) formed in a first layer, like the first preferred embodiment. The basic cell 1 further comprises second layer metal lines 52 and third layer aluminum lines 53 formed in second and third layers different from the first layer. The second layer metal lines 52 and third layer aluminum lines 53 are used as lines (transistor lines) for the transistor portions PT and NT.

The second layer metal lines 52 are electrically connected selectively to the first layer metal lines 7 through the first via holes 8, and the third layer aluminum lines 53 are electrically connected selectively to the first layer metal lines 7 through the first via holes 8. Electrical connection between the second layer metal lines 52 and the third layer aluminum lines 53 are made selectively through second via holes 54.

Wiring operation by means of the second layer metal lines 52 and the third layer aluminum lines 53 for macro cell layout provides a macro cell for a combinational logic circuit containing an AND gate G1 having three inputs SA to SC and one output Y and an NOR gate G2 as shown in FIG. 6. The signal names are illustrated for the lines receiving the input signals SA to SC and the line providing the output signal Y in FIGS. 4 and 5.

Like the first and second preferred embodiments, the gate array approach semiconductor integrated circuit of the third preferred embodiment is designed such that the first layer metal lines 7A extend outwardly beyond the diffused regions to form the out-of-diffused-region connecting regions for electrical connection over the regions external to the diffused regions.

Thus the electrical connection to the objects to be connected other than the diffused regions via the first layer metal lines 7A is made through the out-of-diffused-region connecting regions of the first layer metal lines 7A. This allows the entire areas of the first layer metal lines 7A over the diffused regions to be used for electrical connection to the diffused regions.

Consequently, a sufficient number of contact holes 6 are formed in the first layer metal lines 7A over the diffused regions to hold a good electrical connection between the first layer metal lines 7A and the diffused regions. Therefore, the wiring operation in the subsequent step does not vary the operating characteristics of the transistors.

In addition, the macro cell for the relatively complicated combinational logic circuit as shown in FIG. 6 is formed by using the third layer aluminum lines 53.

<Fourth Preferred Embodiment>

Figure 7:
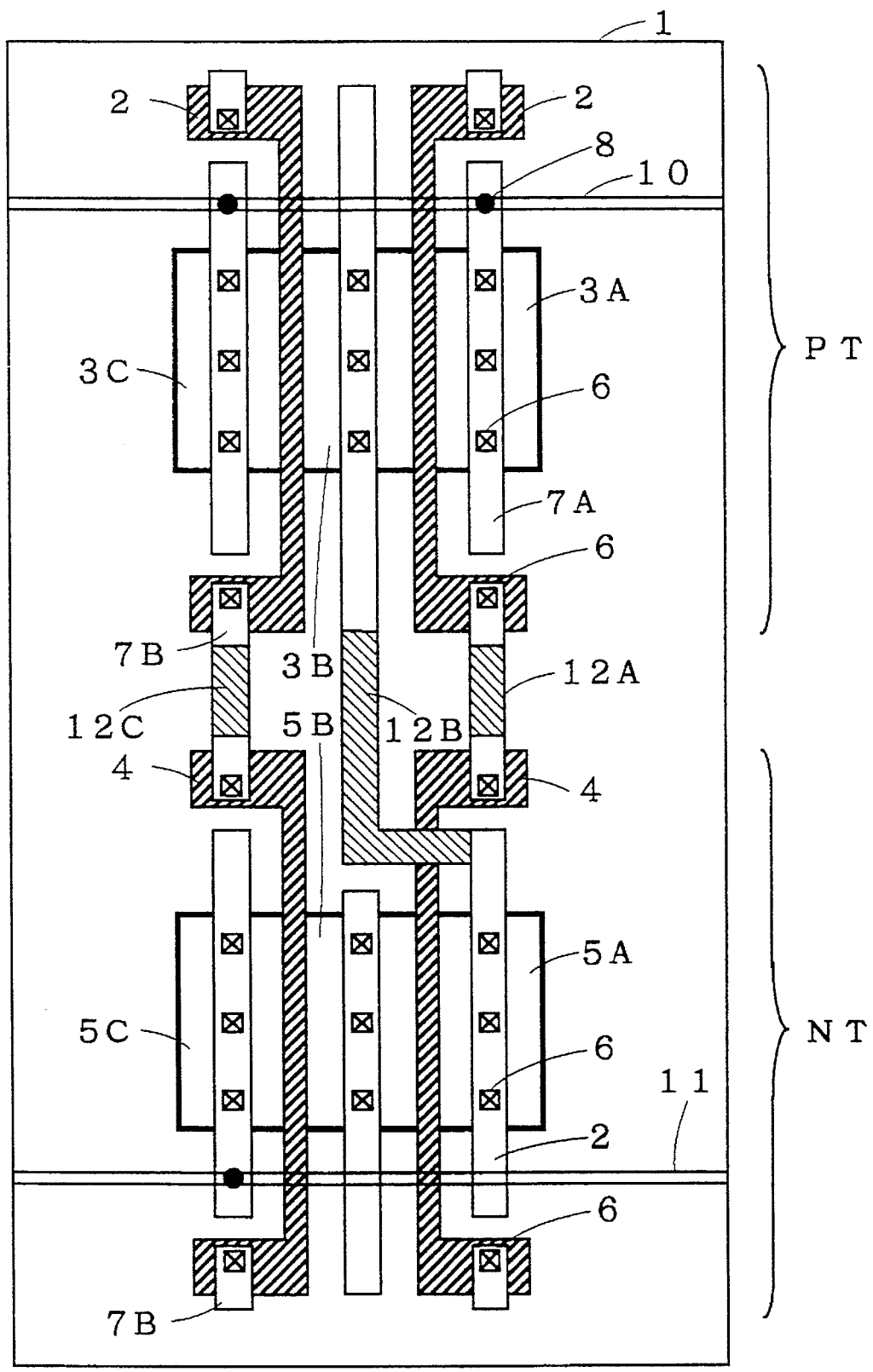
FIG. 7 is a plan view of the basic cell for the gate array approach semiconductor integrated circuit according to a fourth preferred embodiment of the present invention.

FIG. 7 is a plan view of one of the plurality of basic cells arranged in the gate array approach semiconductor integrated circuit according to a fourth preferred embodiment of the present invention. Like the first to third preferred embodiments, the basic cells 1 of the fourth preferred embodiment shown in FIG. 7 are regularly arranged within the logic gate region 20 on the gate array chip 18 as shown in FIG. 2.

Referring to FIG. 7, first layer metal line patter ns 12A to 12C formed in the same layer as the first layer metal lines 7A and 7B are substituted for the second layer metal lines 9A to 9C. The first layer metal line patterns 12A and 12C are formed between and electrically connected to the first layer metal lines 7B in the PMOS transistor portion PT and the first layer metal lines 7B in the NMOS transistor portion NT. The first layer metal line pattern 12B is electrically connected to the first layer metal line 7A over the P-type diffused region 3B and to the first layer metal line 7A over the N-type diffused region 5A. That is, the first layer metal line patterns 12A to 12C are used as lines (transistor lines) for the transistor portions PT and NT.

In the basic cell 1 of the fourth preferred embodiment as above constructed, the second layer metal lines required for use in customization are only the second layer metal line 10 serving as the power supply line and the second layer metal line 11 serving as the ground line. Thus, the usable range of the second layer metal lines of the fourth preferred embodiment is greater than that of the second preferred embodiment, which accordingly permits an improved level of integration of lines between the basic cells 1 over the second preferred embodiment.

<Fifth Preferred Embodiment>

Figure 8:
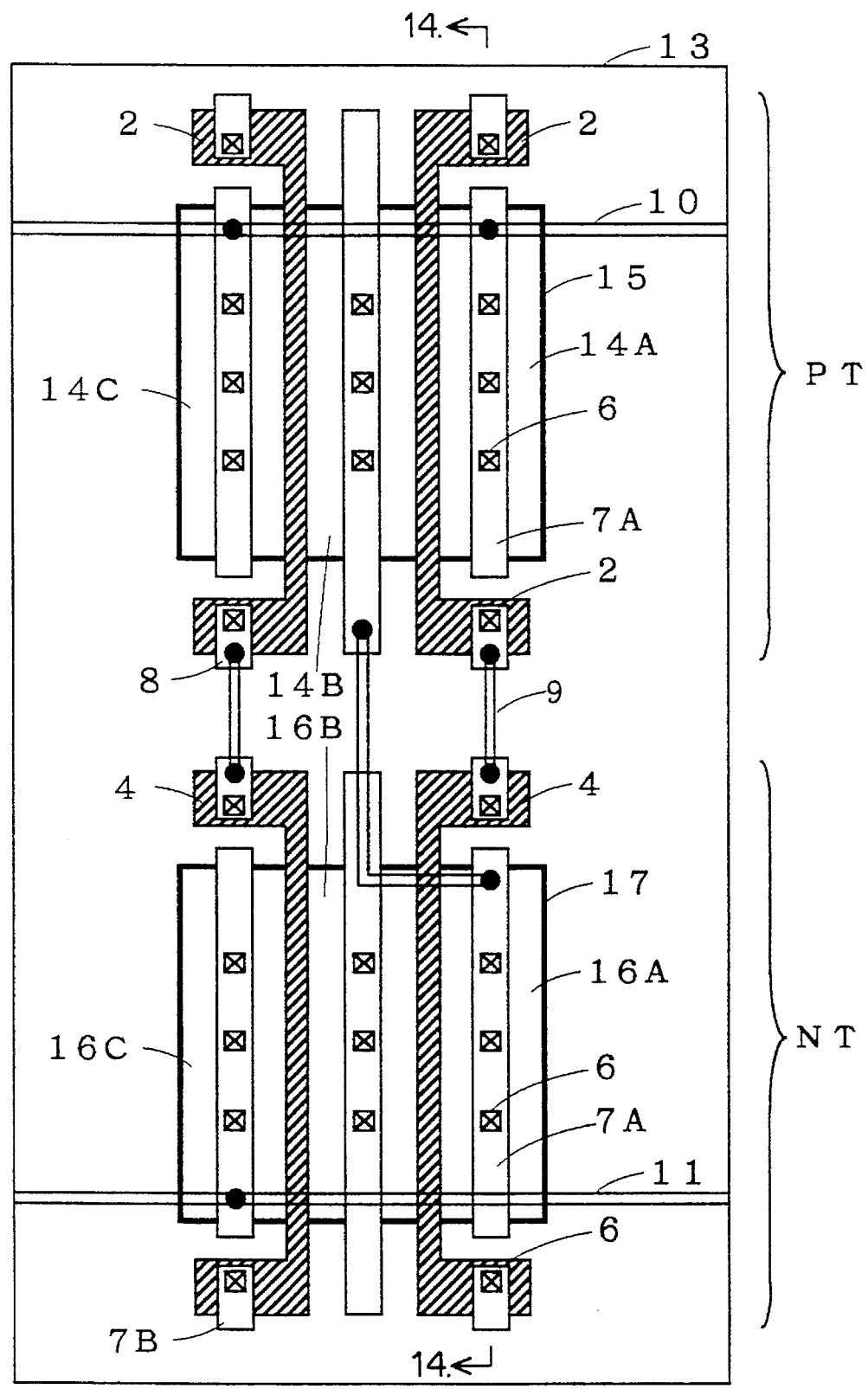
FIG. 8 is a plan view of an exemplary basic cell fabricated by a method of fabricating a gate array approach semiconductor integrated circuit according to a fifth preferred embodiment of the present invention.

FIG. 8 is a plan view of a basic cell fabricated by a method of fabricating the basic cell in the gate array approach semiconductor integrated circuit according to a fifth preferred embodiment of the present invention. Referring to FIG. 8, the PMOS transistor portion PT includes a relatively large field region 15 and P-type diffused regions 14 (14A to 14C) having a length in a gate width direction greater than that of the P-type diffused regions 3 of the basic cell 1 of the second preferred embodiment shown in FIG. 3, to provide a large gate width thereof. Likewise, the NMOS transistor portion NT includes a relatively large field region 17 and N-type diffused regions 16 (16A to 16C) having a length in a gate width direction greater than that of the N-type diffused regions 5 of the basic cell 1 of the second preferred embodiment, to provide a large gate width thereof.

The basic cell 1 of the second preferred embodiment and the basic cell 13 of the fifth preferred embodiment construct the same macro cell for the two-input NAND gate except the gate widths of the PMOS transistor portion PT and NMOS transistor portion NT.

It should be noted that the transistors of the basic cell 1 of the second preferred embodiment have a relatively small gate width for operation with low power consumption, and the transistors of the basic cell 13 of the fifth preferred embodiment have a relatively large gate width for operation at high speeds.

FIGS. 9 to 13 are cross-sectional views illustrating a method of fabricating the basic cell 1 of the second preferred embodiment (first fabrication method). FIGS. 9 to 13 correspond to the section taken along the line B—B of FIG. 3.

Figure 9:
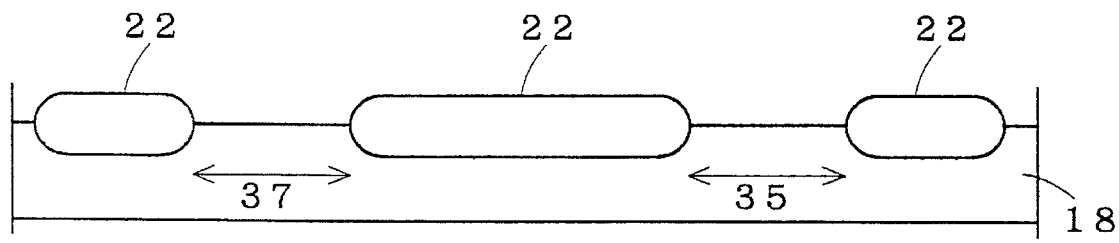
FIGS. 9 to 18 are cross-sectional views illustrating the method of fabricating the gate array approach semiconductor integrated circuit according to the fifth preferred embodiment of the present invention.

Referring now to FIG. 9, field oxide films 22 are selectively formed on the surface of the gate array chip 18 in a well known manner. The surface of the gate array chip 18 between the field oxide films 22 is specified as field regions 35 and 37.

Figure 10:
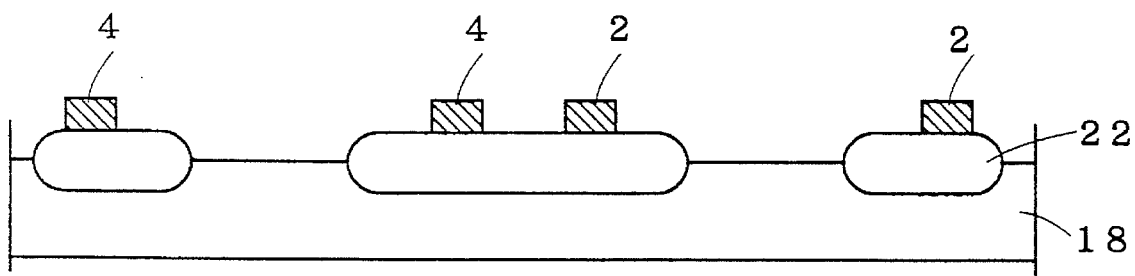

Thin oxide films (not shown) are selectively formed on the gate array chip 18 in a well known manner, and the gate electrodes 2 and 4 are then formed on the thin oxide films (FIG. 10).

Figure 11:
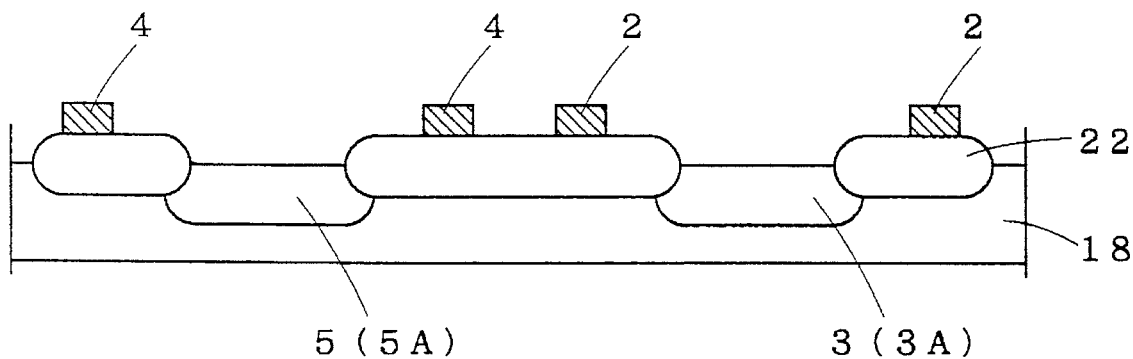

The P-type and N-type diffused regions 3 and 5 are formed within the field regions 35 and 37, respectively, in a well known manner using the gate electrodes 2 and 4 as a mask as shown in FIG. 11.

Figure 12:
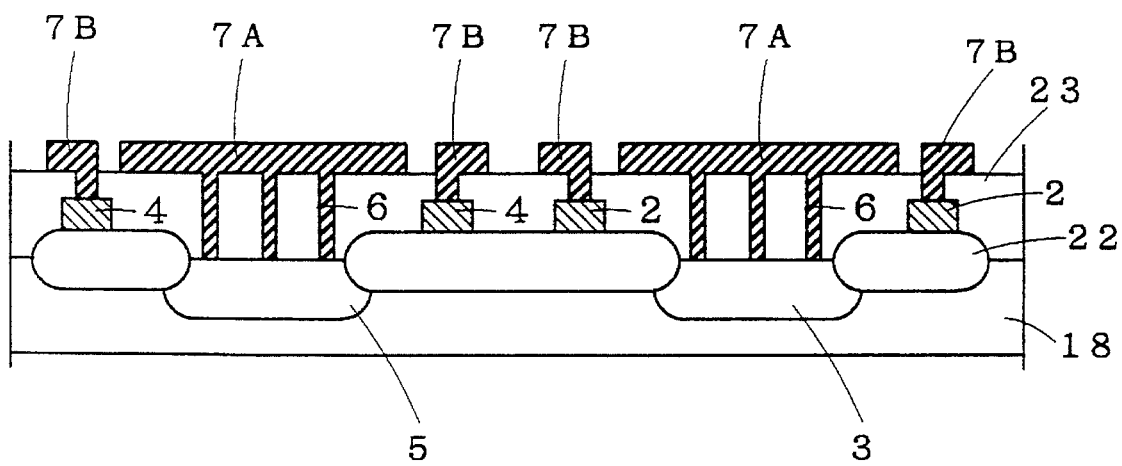

As shown in FIG. 12, a layer insulating film 23 is formed over the top surface, and the contact holes 6 are selectively formed in the layer insulating film 23. Then an aluminum layer is deposited over the top surface and is then patterned to form the first layer metal lines 7A and 7B.

Figure 13:
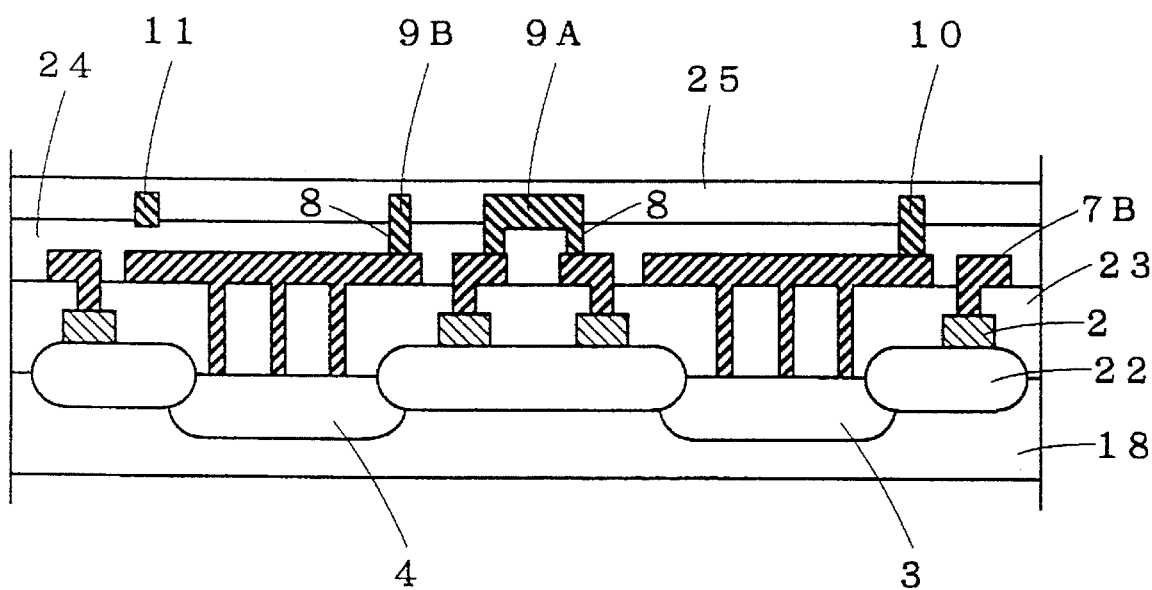

Referring to FIG. 13, a layer insulating film 24 is formed on the top surface, and the first via holes 8 are formed in the layer insulating film 24. Then an aluminum layer is deposited over the top surface and is then patterned to form the second layer metal lines 9 to 11. A layer insulating film 25, in turn, is formed over the top surface.

FIGS. 14 to 18 are cross-sectional views illustrating a method of fabricating the basic cell 13 of FIG. 8 (second fabrication method). FIGS. 14 to 18 correspond to the section taken along the line C—C of FIG. 8.

Figure 14:
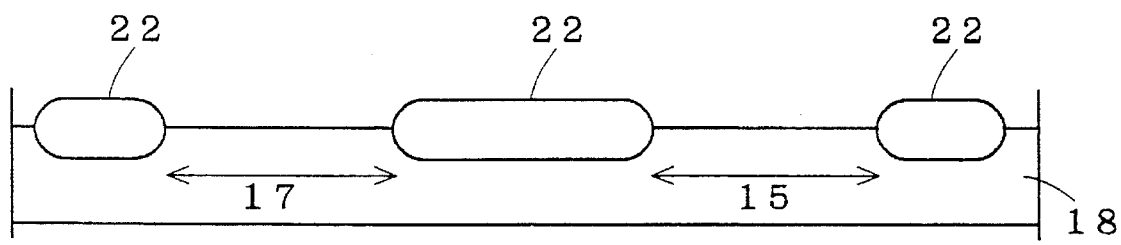

Referring to FIG. 14, the field oxide films 22 are selectively formed on the surface of the gate array chip 18 in a well known manner. The surface of the gate array chip 18 between the field oxide films 22 is specified as the field regions 15 and 17. The field regions 15 and 17 are greater than the field regions 35 and 37 of the basic cell 1.

Figure 15:
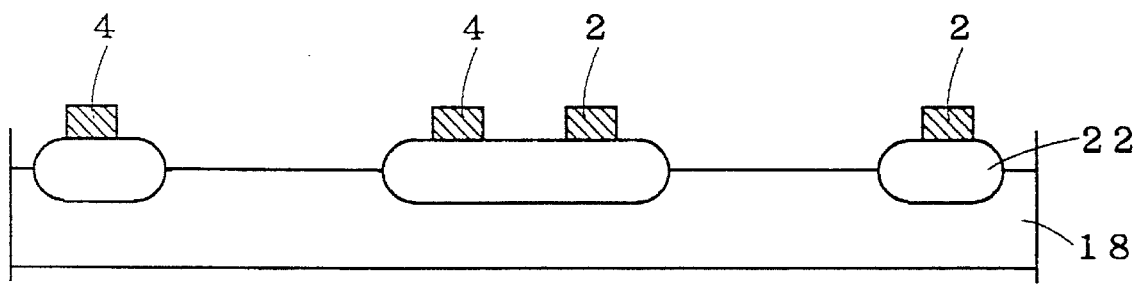

Thin oxide films (not shown) are selectively formed on the gate array chip 18 in a well known manner, and the gate electrodes 2 and 4 are then formed on the thin oxide films, as shown in FIG. 15.

Figure 16:
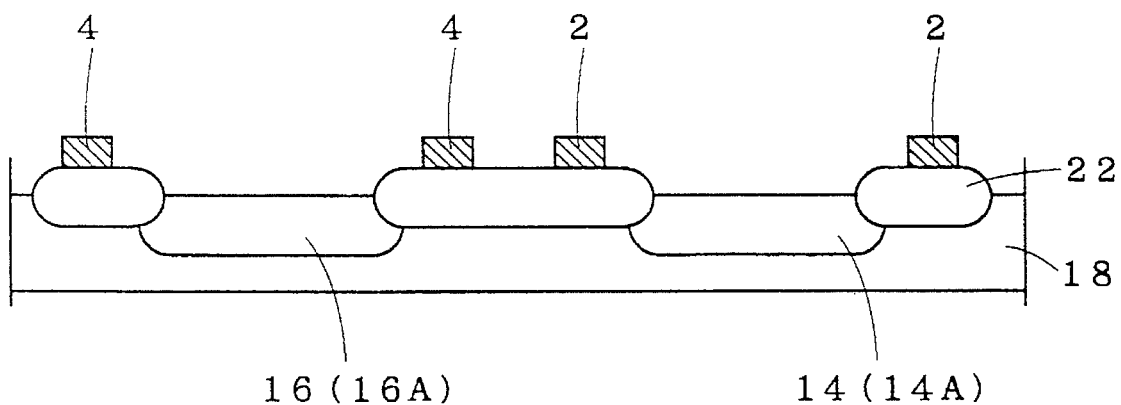

The P-type and N-type diffused regions 14 and 16 are formed within the field regions 15 and 17, respectively, in a well known manner using the gate electrodes 2 and 4 as a mask as shown in FIG. 16.

Figure 17:
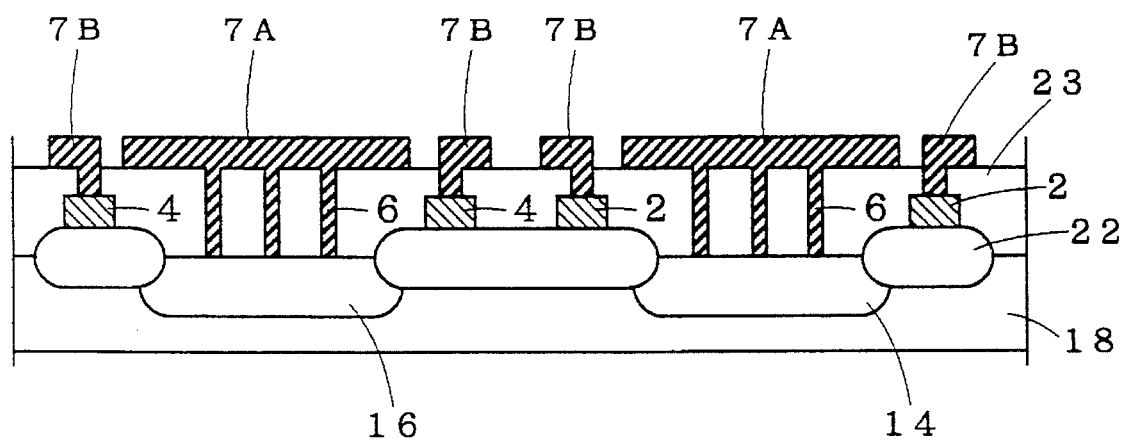

As shown in FIG. 17, the layer insulating film 23 is formed over the top surface, and the contact holes 6 are selectively formed in the layer insulating film 23. Then an aluminum layer is deposited over the top surface and is then patterned to form the first layer metal lines 7A and 7B.

Figure 18:
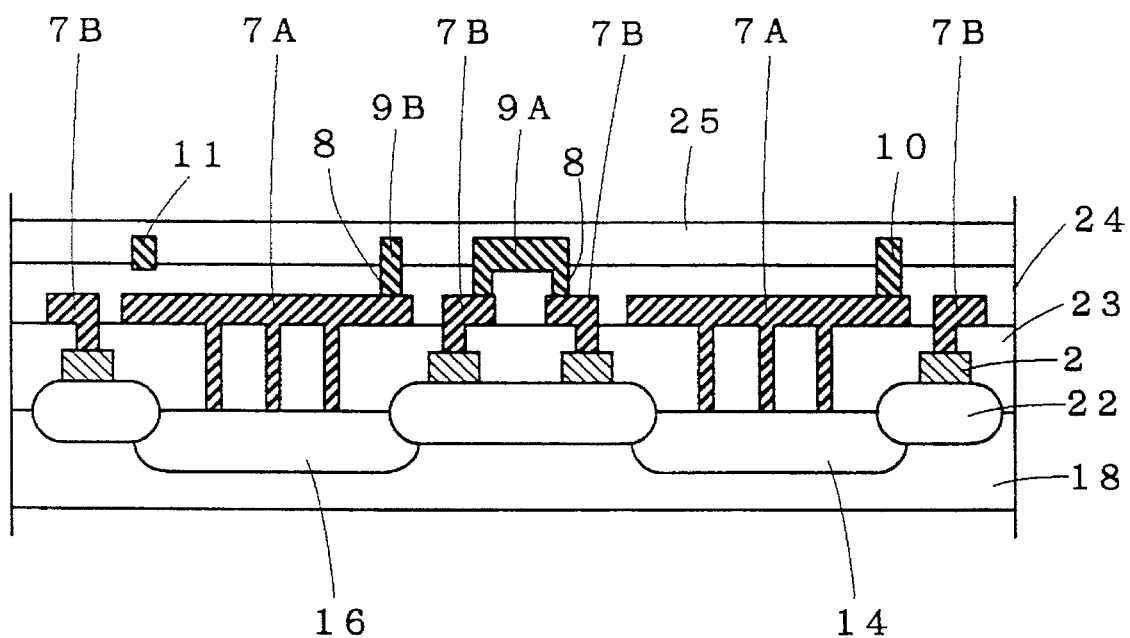

Referring to FIG. 18, the layer insulating film 24 is formed on the top surface, and the first via holes 8 are formed in the layer insulating film 24. Then an aluminum layer is deposited over the top surface and is then patterned to form the second layer metal lines 9 to 11. The layer insulating film 25, in turn, is formed over the top surface.

Comparison is made between the above described first and second fabrication methods. The first and second methods comprises identical steps except that the first method comprises the step of fabricating the field regions 35 and 37 (FIG. 9) and the second method comprises the step of fabricating the field regions 15 and 17 (FIG. 14).

Specifically, only the change of the field step in the first method of fabricating the basic cell 1 readily provides the second method of fabricating the basic cell 13 having the transistor portions of a large gate width.

Consequently, a plurality of basic cells having transistor portions of different gate widths may be produced only by very simple change of the field step.

<Sixth Preferred Embodiment>

Figure 19:
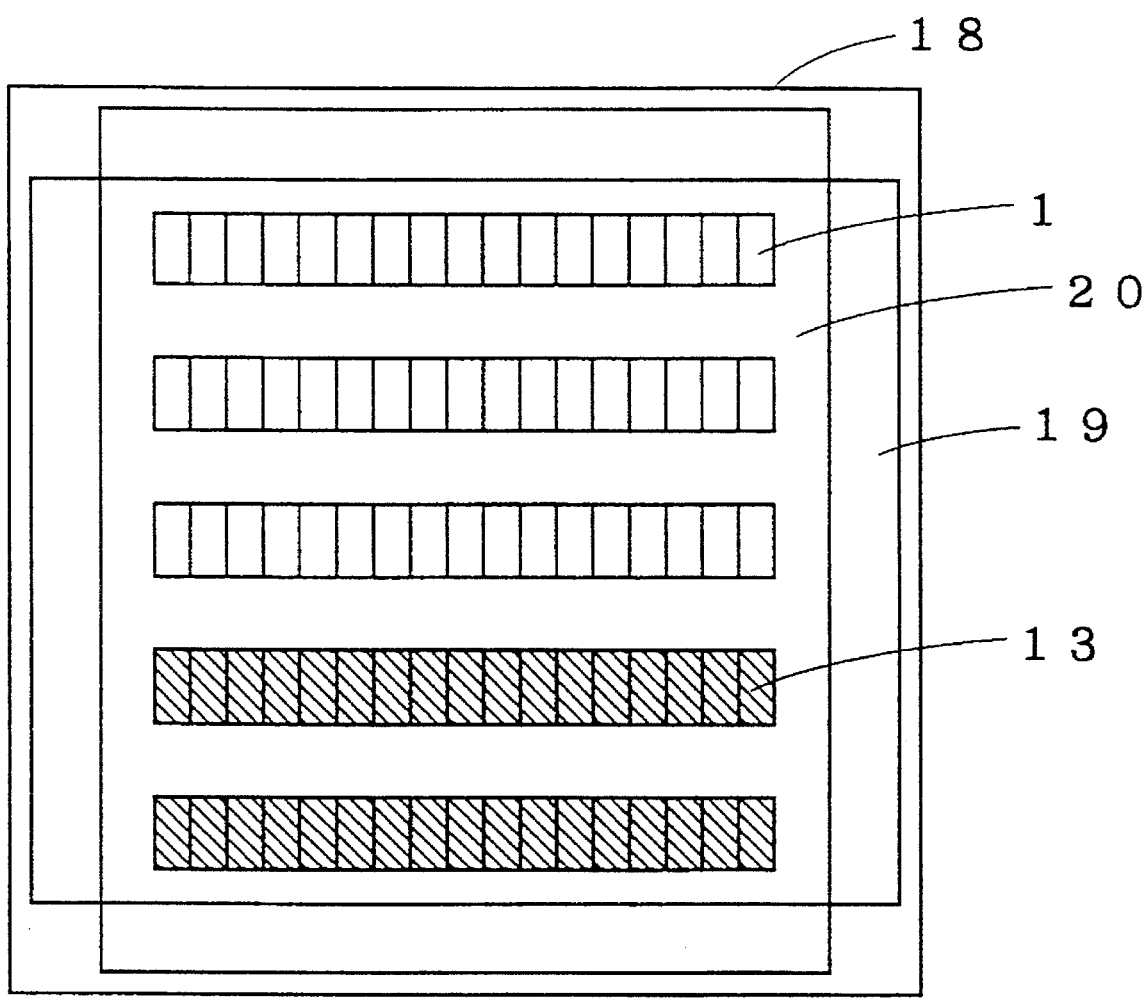
FIG. 19 illustrates the gate array approach semiconductor integrated circuit according to a sixth preferred embodiment of the present invention.

FIG. 19 is a plan view of the gate array approach semiconductor integrated circuit according to a sixth preferred embodiment of the present invention. As shown in FIG. 19, three rows of basic cells 1 of a relatively small gate width for operation with low power consumption and two rows of basic cells 13 of a relatively large gate width for operation at high speeds are arranged within the logic gate region 20 on the gate array chip 18. The reference numeral 19 designates the input-output interface portion.

Such an arrangement of a plurality of types of basic cells (the basic cells 1 and 13) of different gate widths on the gate array chip 18 allows selection of the basic cells adapted for desired operating characteristics (low power consumption operation and high-speed operation) in customization without changing the layout (wiring pattern) within the macro cell. This requires only one layout library for a macro cell of the same logic to achieve a logic circuit having optimized operating characteristics relatively easily.

<Seventh Preferred Embodiment>

Figure 20:
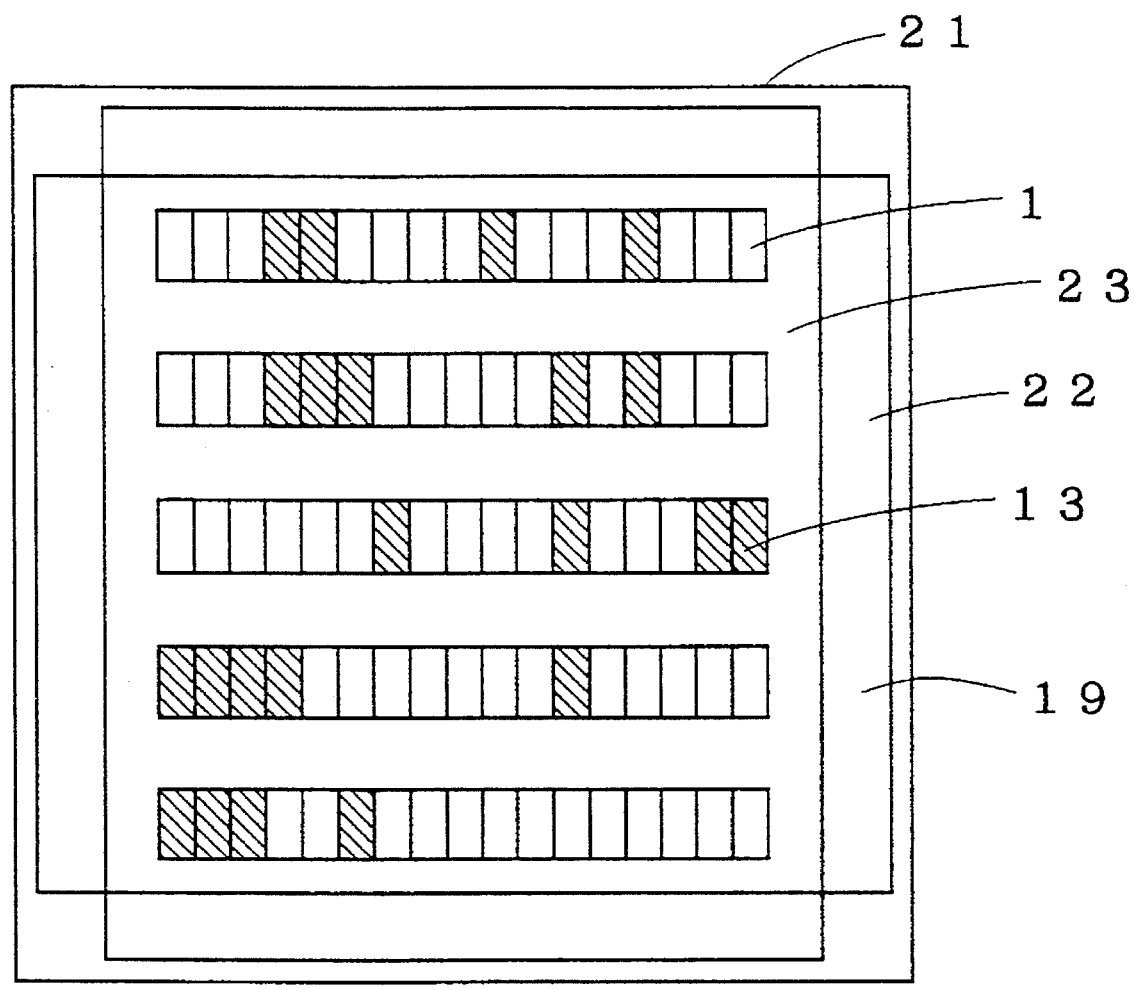
FIG. 20 illustrates a method of arranging cells in the gate array approach semiconductor integrated circuit according to a seventh preferred embodiment of the present invention.
Figure 21:
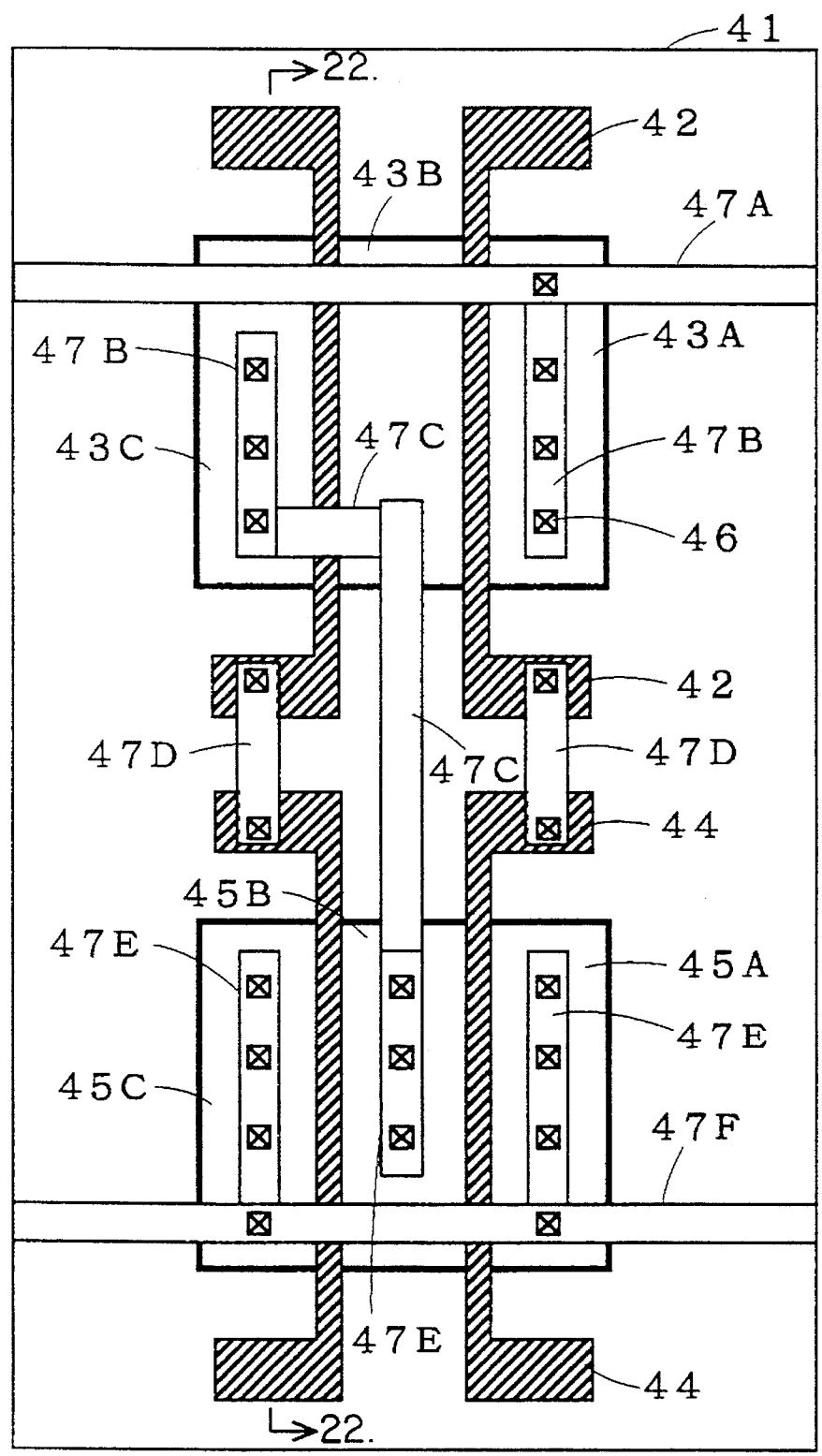
FIG. 21 is a plan view of a basic cell construction of a conventional gate array approach semiconductor integrated circuit.
Figure 22:
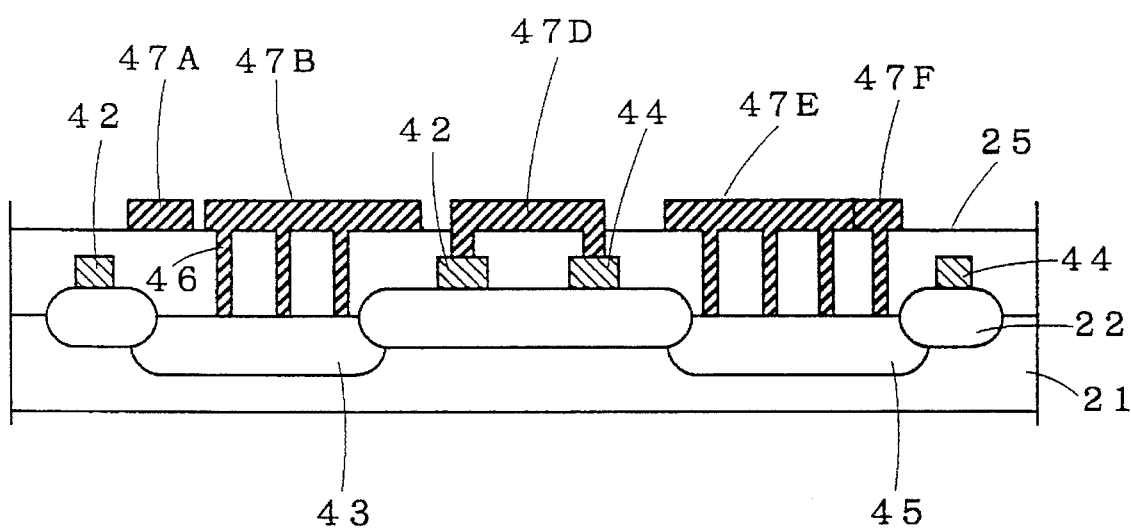
FIG. 22 is a cross-sectional view taken along the line A—A of FIG. 21.

FIG. 20 is a plan view of the gate array approach semiconductor integrated circuit according to a seventh preferred embodiment of the present invention. Referring to FIG. 20, the plurality of basic cells 1 of the relatively small gate width for operation with low power consumption and the plurality of basic cells 13 of the relatively large gate width for operation at high speeds are arranged in mixed relation within the logic gate region 20 on the gate array chip 18. The reference numeral 19 designates the input-output interface portion. The mixed basic cells 1 and 13 are arranged so as to be adapted for the operating characteristics (low power consumption operation and high-speed operation) of the desired logic circuit.

The arrangement of the plurality of types of mixed basic cells (the basic cells 1 and 13) adapted for the operating characteristics of the desired logic circuit on the gate array chip 18 provides the desired operating characteristics (low power consumption operation and high-speed operation) in customization without changing the layout (wiring pattern) within the macro cell. This requires only one layout library for a macro cell for the desired logic circuit with the operating characteristics to achieve the logic circuit having the optimized operating characteristics relatively easily.

As shown in FIG. 20, the mixed basic cells 1 and 13 are produced relatively easily in the same process steps except the change of the field pattern as described in the fifth preferred embodiment.

While the invention has been shown and described in detail, the foregoing description is in all aspects illustrative and not restrictive. It is therefore understood that numerous modifications and variations can be devised without departing from the scope of the invention.

What is claimed is:

1. A semiconductor integrated circuit including a plurality of basic cells arranged on a semiconductor chip, each of said plurality of basic cells including a transistor portion, said transistor portion comprising:

first and second diffused regions of a predetermined conductivity type and selectively formed on said semiconductor chip;

a control electrode formed on a region between said first and second diffused regions; and a diffused region line formed on a wiring-required diffused region, said wiring-required diffused region being at least one of said first and second diffused regions, said diffused region line being electrically connected to said wiring-required diffused region, wherein:

said diffused region line of said transistor portion extends outwardly beyond said wiring-required diffused region and includes an out-of-diffused-region connecting region for electrical connection over a region external to said wiring-required diffused region;

said diffused region line is formed in a first layer;

each of said plurality of basic cells further includes
a first transistor line formed in a second layer different from said first layer, and first contact means having a first end connected to said first transistor line and a second end connected to said out-of-diffused-region connecting region of said diffuse region line for electrical connection between said first transistor line and said diffused region line;

said transistor portion includes a plurality of transistor portions each including a control electrode line formed in said first layer over a region of said control electrode, and second contact means having a first end connected to said first transistor line and a second end connected to said control electrode line for electrical connection between said first transistor line and said control electrode line; and at least said first and second contact means electrically connect at least two of said plurality of transistor portions to establish respective a first logic function.

2. The semiconductor integrated circuit of claim 1, wherein each of said plurality of transistor portions further includes:
a second transistor line formed in a third layer different from said first and second layers; and
third contact means for electrically connecting one of said diffused region line, said control electrode line and said first transistor line to the second transistor line, and said third contact means, in cooperation with said first and second contact means, electrically connects at least two of said plurality of transistor portions to establish said first logic function.

3. The semiconductor integrated circuit of claim 2, wherein said first, second and third contact means electrically connect said transistor portions of said plurality of basic cells to establish a second logic function.

4. The semiconductor integrated circuit of claim 1, wherein each of said plurality of basic cells includes
a second transistor line formed in said first layer and electrically connected to said control electrode lines or said diffused region lines of said plurality of transistor portions, and said second transistor line, in cooperation with said first and second contact means, electrically connects at least two of said plurality of transistor portions to establish said first logic function.

5. The semiconductor integrated circuit of claim 4, wherein some of said plurality of transistor portions include PMOS transistors, and the others thereof include NMOS transistors.

* * * * *